United States Patent
Hwang et al.

(10) Patent No.: US 7,026,178 B2
(45) Date of Patent: Apr. 11, 2006

(54) METHOD FOR FABRICATING A VCSEL WITH ION-IMPLANTED CURRENT-CONFINEMENT STRUCTURE

(75) Inventors: Wen-Yen Hwang, Sugar Land, TX (US); Klaus Alexander Anselm, Sugar Land, TX (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 701 days.

(21) Appl. No.: 09/993,239

(22) Filed: Nov. 13, 2001

(65) Prior Publication Data

US 2003/0091083 A1 May 15, 2003

(51) Int. Cl.
*H01L 21/66* (2006.01)

(52) U.S. Cl. .............................. 438/22; 438/29; 438/32; 438/38

(58) Field of Classification Search .................. 438/22, 438/29–32, 39; 372/45–46, 50
See application file for complete search history.

(56) References Cited

U.S. PATENT DOCUMENTS

| | | | |
|---|---|---|---|
| 4,949,350 A | 8/1990 | Jewell et al. |
| 5,031,187 A | 7/1991 | Orenstein et al. |
| 5,115,442 A | 5/1992 | Lee et al. |

(Continued)

OTHER PUBLICATIONS

Qian, Y. et al., "Long Wavelength (1.3 μm) Vertical–Cavity Surface–Emitting Lasers With a Wafer–Bonded Mirror and an Oxygen–Implanted Confinement Region," *Appl. Phys. Lett.* vol. 71, No. 1, (1997), pp. 25–27.

Ridway, M. C., et al., "Single–Step Implant Isolation of p+–InP with 5–MeV 0 Ions," *Appl. Phys. Lett.*, vol. 60, No. 24, (1992), pp. 3010–3012.

Huffaker, D. L. et al., "Native–Oxide Defined Ring Contact for Low Threshold Vertical–Cavity Lasers," *Appl. Phys. Lett.*, vol.65, No. 1, (1994), pp. 97–99.

Lee, Y. H. et al., "Top–Surface–Emitting GaAs Four–Quantum–Well Lasers Emitting at 0.85μm", *Electronics Letters*, vol. 26, No.11, (1990), pp. 710–711.

Choquette, K. D., et al., "Low Threshold Voltage Vertical–Cavity Lasers Fabricated by Selective Oxidation," *Electronics Letters*, vol. 30, No. 24, (1994), pp. 2043–2044.

Deng, H. and Deppe, D. G. , "Oxide–Confined Vertical–Cavity Lser With Additional Etched Void Confinement," *Electronics Letters*, vol. 32, No. 10, (1996), pp. 900–901.

*Primary Examiner*—Dung A. Le
(74) *Attorney, Agent, or Firm*—N. Stephan Kinsella (57) ABSTRACT

Methods for fabricating a VCSEL having current confinement, the VCSEL having a substrate, a semiconductor active region, and a bottom mirror disposed between the substrate and the active region. A first top spacer layer is epitaxially grown on the active region, the first top spacer layer comprising a current-spreading buffer layer disposed on the active region, a current-confinement layer disposed on the buffer layer, and a current-spreading platform layer disposed on the current-confinement layer, wherein the combined thickness of the platform and current-confinement layers is less than the thickness of the buffer layer. A current-confinement structure having an annular region of enhanced resistivity and a central aperture of comparatively lower resistivity is formed in the current-confinement layer using ion implantation. Subsequently, epitaxial regrowth is performed to form a second top spacer layer on the platform layer, said second top spacer layer comprising a top current-spreading layer. The resulting current-confinement structure is the result of a shallower ion implantation and thus has more precise dimensions and can be closer to the active region.

47 Claims, 2 Drawing Sheets

U.S. PATENT DOCUMENTS

| | | |
|---|---|---|
| 5,193,098 A | 3/1993 | Welch et al. |
| 5,219,785 A | 6/1993 | Welch et al. |
| 5,256,596 A | 10/1993 | Ackley et al. |
| 5,328,854 A | 7/1994 | Vakhshoori et al. |
| 5,594,751 A | 1/1997 | Scott |
| 5,764,674 A | 6/1998 | Hibbs-Brenner et al. |
| 5,893,722 A | 4/1999 | Hibbs-Brenner et al. |
| 6,044,100 A | 3/2000 | Hobson et al. |
| 6,169,756 B1 | 1/2001 | Chirovsky et al. |
| 6,542,530 B1 * | 4/2003 | Shieh et al. ............ 372/46 |

* cited by examiner

METHOD FOR FABRICATING A VCSEL WITH ION-IMPLANTED CURRENT-CONFINEMENT STRUCTURE

BACKGROUND OF THE INVENTION

1. Field of the Invention

This invention relates to electrically-pumped vertical-cavity surface-emitting lasers (VCSELs) and, in particular, to electrically-pumped VCSELs having current confinement.

2. Description of the Related Art

The following descriptions and examples are not admitted to be prior art by virtue of their inclusion within this section.

Lasers have a wide range of industrial and scientific uses. There are several types of lasers, including gas lasers, solid-state lasers, liquid (dye) lasers, and free electron lasers. Semiconductor lasers are also in use. In semiconductor lasers, electromagnetic waves are amplified in a semiconductor superlattice structure. Semiconductor lasers may be diode lasers (bipolar) or non-diode lasers such as quantum cascade (QC) lasers (unipolar). Semiconductor lasers are used for a variety of applications and can be built with different structures and semiconductor materials, such as gallium arsenide (GaAs).

The use of semiconductor lasers for forming a source of optical energy is attractive for a number of reasons. Semiconductor lasers have a relatively small volume and consume a small amount of power as compared to conventional laser devices. Further, semiconductor lasers can be fabricated as monolithic devices, which do not require a combination of a resonant cavity with external mirrors and other structures to generate a coherent output laser beam.

A semiconductor laser typically comprises an active (optical gain) region sandwiched between two mirrors, one of which serves as the "exit" mirror. When the active region is pumped with an appropriate pumping energy, it produces photons, some of which resonate and build up to form coherent light in the resonant cavity formed by the two mirrors. A portion of the coherent light built up in the resonating cavity formed by the active region and top and bottom mirrors passes through one of the mirrors (the exit mirror) as the output laser beam.

Various forms of pumping energy may be utilized to cause the active region to begin to emit photons. For example, semiconductor lasers of various types may be electrically pumped (EP) (by a DC or alternating current), or pumped in other ways, such as by optical pumping (OP) or electron beam pumping. EP semiconductor lasers are typically powered by applying an electrical potential difference across the active region, which causes a current to flow therein. As a result of the potential applied, charge carriers (electrons and holes) are injected from opposite directions into an active region where recombination of electron and holes occurs. There are two kinds of recombination events, i.e. radiative and non-radiative, concurrently happening in the active region. When radiative recombination occurs, a photon is emitted with the same energy as the difference in energy between the hole and electron energy states. Some of those photons travel in a direction perpendicular to the reflectors of the laser. As a result of the ensuing reflections, the photons can travel through the active region multiple times.

Stimulated emission occurs when radiative recombination of an electron-hole pair is stimulated by interaction with a photon. In particular, stimulated emission occurs when a photon with an energy equal to the difference between an electron's energy and a lower energy interacts with the electron. In this case, the photon stimulates the electron to fall into the lower energy state, thereby emitting a second photon. The second photon will have the same energy and frequency as the original photon, and will also be in phase with the original photon. Thus, when the photons produced by spontaneous electron transition interact with other high energy state electrons, stimulated emission can occur so that two photons with identical characteristics are present. (Viewed as waves, the atom emits a wave having twice the amplitude as that of the original photon interacting with the atom.) If a sufficient amount of radiative recombinations are stimulated by photons, the number of photons traveling between the reflectors tends to increase, giving rise to amplification of light and lasing. The result is that coherent light builds up in the resonant cavity formed by the two mirrors, a portion of which passes through the exit mirror as the output laser beam.

Semiconductor lasers may be edge-emitting lasers or surface-emitting lasers (SELs). Edge-emitting semiconductor lasers output their radiation parallel to the wafer surface, while in SELs, the radiation output is perpendicular to the wafer surface. One type of SEL is the vertical-cavity surface-emitting laser (VCSEL). The "vertical" direction in a VCSEL is the direction perpendicular to the plane of the substrate on which the constituent layers are deposited or epitaxially grown, with "up" being typically defined as the direction of epitaxial growth. In some designs, the output laser beam is emitted out of the top side, in which case the top mirror is the exit mirror. In other designs, the laser beam is emitted from the bottom side, in which case the bottom mirror is the exit mirror. The exit mirror typically has slightly lower reflectivity than the other mirror.

VCSELs have many attractive features compared to edge-emitting lasers, such as low threshold current, single longitudinal mode, a circular output beam profile, and scalability to monolithic laser arrays. The shorter cavity resonator of the VCSEL provides for better longitudinal mode selectivity, and hence narrower linewidths. Additionally, because the output is perpendicular to the wafer surface, it is possible to test fabricated VCSELs on the wafer before extensive packaging is done, in contrast to edge-emitting lasers, which must be cut from the wafer to test the laser. Also, because the cavity resonator of the VCSEL is perpendicular to the layers, there is no need for the cleaving operation common to edge-emitting lasers.

The VCSEL structure usually consists of an active (optical gain) region sandwiched between two mirrors, such as distributed Bragg reflector (DBR) mirrors. Both EP and OP VCSEL designs are possible. The two mirrors may be referred to as a top DBR and a bottom DBR. Because the optical gain is low in a vertical cavity design, the reflectors require a high reflectivity in order to achieve a sufficient level of feedback for the device to lase. DBRs are typically formed of multiple pairs of layers referred to as mirror pairs; DBRs are sometimes referred to as mirror stacks. The DBR mirrors of a typical VCSEL can be constructed from dielectric (insulating) or semiconductor layers (or a combination of both, including metal mirror sections). The pairs of layers are formed of a material system generally consisting of two materials having different indices of refraction; for semiconductor DBRs, the layers are typically selected so that they are easily lattice matched to the other portions of the VCSEL, to permit epitaxial fabrication techniques.

For semiconductor DBRs, the number of mirror pairs per stack may range from 20–40 pairs to achieve a high percentage of reflectivity, depending on the difference between the refractive indices of the layers. A larger number of mirror pairs increases the percentage of reflected light (reflectivity). The difference between the refractive indices of the layers of the mirror pairs can be higher in dielectric DBRs, generally imparting higher reflectivity to dielectric DBRs than to semiconductor DBRs for the same number of mirror pairs and overall thickness. Conversely, in a dielectric DBR, a smaller number of mirror pairs can achieve the same reflectivity as a larger number in a semiconductor DBR. However, it is sometimes necessary or desirable to use semiconductor DBRs, despite their lower reflectivity/greater thickness, to conduct current, for example (e.g., in an EP VCSEL). Semiconductor DBRs also have higher thermal (heat) conductivity than do dielectric DBRs, making them more desirable for heat-removal purposes, other things being equal. Semiconductor DBRs may also be preferred for manufacturing reasons (e.g., a thicker DBR may be needed for support) or fabrication reasons (e.g., an epitaxial, i.e. semiconductor, DBR may be needed if other epitaxial layers need to be grown on top of the DBR).

When properly designed, these mirror pairs will cause a desired reflectivity at the laser wavelength. Typically in a VCSEL, the mirrors are designed so that the bottom DBR mirror (i.e. the one interposed between the substrate material and the active region) has nearly 100% reflectivity, while the top (exit) DBR mirror has a reflectivity that may be 98%–99.5% (depending on the details of the laser design). The partially reflective top (exit) mirror passes a portion of the coherent light built up in the resonating cavity formed by the active region and top and bottom mirrors. Of course, as noted above, in other designs, the bottom mirror may serve as the exit mirror and the top mirror has the higher reflectivity.

The transverse extent of the optical cavity must be defined in a VCSEL. This is often done by implementing a means of confinement for photons and/or electrons. Electrical or current confinement is also desirable for EP VCSELs, in which electrical current is used to provide the means of pumping the active region to achieve gain. In an EP VCSEL, for example, top and bottom electrical contacts are typically provided above and below the active region so that a pumping current can be applied through the active region. Current-confinement approaches attempt to create a current-confinement structure to confine the pumping current into a relatively small area of the active region. Confining the current in this way is also sometimes referred to as current guiding or funneling. Such a structure may be employed in a VCSEL to block current flow on an annular perimeter region of the VCSEL structure, and to guide or confine the current to a more or less cylindrical center region, which may be referred to as a current aperture or current-confinement aperture. Current confinement can provide lower threshold and higher efficiency, and can help the VCSEL operate with a single spatial mode.

Various techniques have been used to achieve electrical or current confinement, including ion implantation (irradiation) and oxidation approaches, as described in *Vertical-Cavity Surface-Emitting Lasers: Design, Fabrication, Characterization, and Applications*, eds. Carl W. Wilmsen, Henryk Temkin & Larry A. Coldren, Cambridge: Cambridge University Press, chapter 5 (1999). However, the active region can be as small as several microns (μm) in diameter, and the current-confinement structure aperture must be even smaller. Forming a suitable current-confinement structure can therefore be difficult to achieve, depending on the application, VCSEL size, and so forth.

In one current-confinement approach, such as that described in Jewell et al., U.S. Pat. No. 4,949,350, a post is etched through the structure. To be able to contact this structure electrically, the post should be at least tens of microns in diameter. However, for some applications, narrower current confinement may be required than the tens of microns possible with this approach.

In another technique for current confinement, patterned ion implantation into the p-doped semiconductor top DBR mirror is used to change to properties of some of the semiconductor layers to make them more resistive. This forms an apertured, relatively high-resistivity ion-implanted current-confinement region, which guides the current predominantly through an aperture. In such an approach, implantation of ions into the top DBR mirror can render the material around the laser cavity (or an aperture) relatively nonconductive, thus concentrating the injected current into the active medium. Damage, primarily crystal vacancies created by the implanted ions, compensate the free carriers leading to regions of higher resistivity. The ion dose is typically chosen to sufficiently compensate the dopant impurities in the DBR. The ion implantation energy required to achieve current confinement within a VCSEL depends upon the mass of the ion used and the implant depth desired. Thus the maximum vacancy concentration can be tailored to a specific depth within the DBR mirror.

Various ion species have been employed (e.g., $H^+$, $O^+$, $N^+$, $F^+$), although proton implants are the most common. The peak implant damage is usually designed to occur far enough above the quantum wells of the active region to avoid excessive damage to the active region. An implantation mask of photoresist or plated metal is typically employed to selectively block the ions and thus define the current-confinement structure (and therefore the laser cavity). Ion implantation and related matters are described in Y. H. Lee et al., *Electr. Lett.*, vol. 26, no. 11, pp. 710–711 (1990); T. E. Sale, *Vertical-Cavity Surface-Emitting Lasers*, Research Press Ltd., pp. 117–127 (1995); and *Vertical-Cavity Surface-Emitting Lasers: Design, Fabrication, Characterization, and Applications*, eds. Carl W. Wilmsen, Henryk Temkin & Larry A. Coldren, Cambridge: Cambridge University Press, chapter 5 (1999).

For example, in this ion-implanted approach, light ions such as protons are implanted to relatively deep depths (e.g., about 3 μm), into selected areas of the semiconductor laser surface, damaging the semiconductor crystal lattice and thus rendering those areas relatively nonconductive (more resistive). This forms a layer having resistive sections and a less-resistive aperture portion. As another example, a 300 keV proton implant with a dose of $4 \times 10^{14}$ $cm^{-3}$ could be employed for an 850 nm VCSEL with a 20-period $Al_{0.16}Ga_{0.84}As$/AlAs DBR (2.6 μm thick). Such deep implants near the active region thus define the transverse extent of the laser cavity.

However, ion implantation generally damages the crystalline lattice structure. Sufficient ion implantation energy is therefore employed so that the ion implantation occurs deep within the structure, so that the damage is located primarily under the surface to leave a less damaged semiconductor layer at the surface for contact and current spreading. One drawback of this ion implantation technique is that there is substantial damage to the semiconductor as well as significant vertical and lateral straggle of the deeply implanted ions, which can cause reliability and performance problems with the active region. The ion straggle associated with deep implantation also limits the precision of the dimensions and location of the current aperture. For example, because of the straggle, the diameter of the current-confined region cannot be made as small as may be desired, e.g. it may not be possible to make it smaller than 10 μm in diameter. Both of these factors inhibit scaling the devices to smaller sizes. Another problem is that, as noted above, the peak implant damage is usually designed to occur far enough above the quantum wells of the active region to avoid excessive damage to the active region. Because deep implants are used, employing high implant energy which leads to significant vertical straggle, this means the implanted region has to be comparatively far away from the active region to avoid damaging it. For example, it is estimated that the maximum implant dosages must be located at least about 0.5 μm above the quantum wells, allowing significant current spreading outside the desired laser cavity. This leads to a larger threshold currents and reduced efficiency, and also places limits on how small the pumped region can be.

Another current-confinement technique is described in Chirovsky et al., U.S. Pat. No. 6,169,756 B1, the entirety of which is incorporated herein by reference. This patent describes a technique in which a lower conductivity layer (layer 18.2, in the sole FIGURE; col. 3, lines 30–50) is grown on top of the active region, and then relatively high conductivity, contact-facilitating layer (18.1) is grown on top of the lower conductivity layer. Then, a high resistivity, ion-implanted region or zone (18.3) is formed in the lower conductivity layer (18.2) by implanting this region with relatively heavy ions. However, the ion-implanted region lies within the lower conductivity layer, below another entire layer (the contact-facilitating layer). Thus, the ions must have enough energy to travel through the first, contact-facilitating layer, into the lower conductivity layer, where they implant into the ion-implanted region within the lower conductivity layer. As with the ion-implantation technique described above, this can also limit the precision of the dimensions and location of the current aperture.

One solution to the above-mentioned problems in forming a current-confining structure is to grow different parts of the VCSEL on two wafers, implant into the wafer that does not contain the active region (so as to avoid damaging the active region with ion implantation), and then bond the two wafers together. For example, such an approach is described in Y. Qian et al., *Appl. Phys. Lett.*, vol. 71, no. 1, pp. 25–27 (1997). However, this approach also has significant manufacturing and reliability problems.

Because of problems associated with ion implantation, various oxide confinement based approaches have been explored. In some approaches, insulating oxide layers can be located immediately adjacent to the active region, reducing current spreading and thus giving rise to lower threshold currents that are typically required with conventional ion implanted VCSELs. One current-confinement approach (typically not utilized with VCSELs, however), employs an apertured, high resistivity oxide layer. It is formed by growing an oxide surface layer, then, using mask technology, etching away selected portions of the oxide. The oxide material is insulative (resistive) so current flows only into those areas of the underlying laser structure where the oxide layer has been removed (the aperture). In another approach, the native oxidation of AlGaAs layers may be used to form a resistive layer between the reflector and the active region. See for example D. Huffaker et al., *Appl Phys. Lett.*, vol. 65, no. 1, pp. 97–99 (1994) and K. D. Choquette et al., *Electr. Lett.*, vol. 30, no. 24, pp. 2043–2044 (1994). This approach has several drawbacks, including difficulty in manufacturing, and with control, reproducibility, and uniformity of oxidation; interference with the optical mode due to a large refractive index contrast; and a lack of a good material to oxidize for VCSELs based on materials other than GaAs (such as InP-based VCSELs for telecommunication applications). Selectively oxidized VCSELs can also have reliability problems, e.g. due to sensitivity to thermal shock/cycling.

Selective etching and undercutting of specific layers has also been proposed to form the current guiding aperture. See, for example, Scott et al., U.S. Pat. No. 5,594,751 and H. Deng et al., *Electr. Lett.*, vol. 32, no. 10, pp. 900–901 (1996). However, this approach has significant manufacturability problems.

There is, therefore, a need for an improved current-confinement techniques and structures for guiding the current in semiconductor-based devices, such as VCSELs.

BRIEF DESCRIPTION OF THE DRAWINGS

Other features and advantages of the invention will become apparent upon study of the following description, taken in conjunction with the attached FIGS. 1–4.

DETAILED DESCRIPTION OF THE INVENTION

The present invention provides a semiconductor device, such as a VCSEL, having an improved current-confinement structure and related methods for fabricating such structures and associated devices. In an embodiment, a current-confinement structure is formed in a current-confinement layer of an upper spacer layer (i.e., the layer between the active region and the top mirror). The current-confinement structure may be employed in semiconductor devices, in particular VCSELs. The spacer layer may be referred to as either a current-spreading or spacer layer, because one function is to conduct ("spread" or "guide") current from a supply (coupled via wire bonds or probes to a metal contact electrically coupled to the current-spreading layer) to the active region, and another is to optimally position ("space") the active region axially within the cavity.

In an embodiment, the present invention provides a method for fabricating a device, such as a VCSEL, having a current-confinement structure, by providing an active region and an upper spacer layer above and disposed on the active region. The upper or top spacer layer is a composite of first and second upper spacer layers. The first upper spacer layer is the portion of the upper spacer layer formed epitaxially before forming the current-confinement structure therein by ion implantation, i.e. during epitaxial growth. The second upper spacer layer is the remainder of the composite upper spacer layer, which is formed by subsequent epitaxial growth (regrowth) on the first upper spacer layer, after the ion implantation.

In an embodiment, the first upper spacer layer has a lower, current-spreading "buffer" or separator layer, a comparatively thin current-confinement layer disposed on top of the current-spreading portion, and a thin "platform" layer of current-spreading material suitable for regrowth of the second upper spacer layer on top of the current-confinement layer. The buffer layer (not to be confused with a layer disposed on top of a bulk substrate before growth of a structure or device, which layer is also sometimes referred to as a buffer layer) is a current-spreading layer, one function of which is to provide a "buffer" between the current-confinement layer (which is to be ion implanted) and the active region, to prevent the ion implantation of the current-confinement layer from excessively damaging the active region, in particular its quantum wells. This layer thus protects the active region and serves as a buffer between the ion implantation and the active region. It keeps the peak implant damage far enough above the quantum wells of the active region so that they are not excessively damaged, i.e. damaged enough to appreciably impair performance of the active region. When the active region is not excessively damaged by the ion implantation, it may be said to be substantially free of ion implantation straggle damage. The platform layer is also a current-spreading layer, but serves as a regrowth platform or substrate for subsequent epitaxial regrowth.

The lower current-spreading buffer layer as well as the platform layer are formed of material relatively well-suited for conduction of current and heat, and also relatively less prone to oxidation and/or more suited for removal of native oxidation. They are also sufficiently optically transparent to permit laser light to be emitted through them. This material also has the property that, after ion implantation and subsequent heat (from annealing and/or epitaxial regrowth), the material has either no or a comparatively small amount of enhanced resistivity.

The current-confinement layer consists of material that is able to conduct current and heat, albeit less effectively than the current-spreading material, and that is also able to acquire and maintain a significant degree of enhanced resistivity after being subjected to ion implantation and subsequent annealing heat (e.g., heat from explicit annealing and/or epitaxial regrowth). It is also relatively more prone to oxidation and related oxide-removal problems, e.g. because it contains Al in an embodiment. Thus, the current-confinement layer is sandwiched between current-spreading layers and acquires an enhanced resistivity when subjected to appropriate ion implantation and annealing steps. This is in contrast to the current-spreading layers, which do not retain or acquire enhanced resistivity as well as the current-confinement layer does. In an embodiment, the current-spreading layers do not retain any or substantially enhanced resistivity after being subjected to higher-temperature processing. In an embodiment, the current-confinement layer contains aluminum. It may have a higher resistivity than the surrounding current-spreading layers even before being ion implanted, but this characteristic is not necessary in all embodiments.

The thin platform layer, also formed of current-spreading material, is epitaxially grown on the current-confinement layer before the ion bombardment. This platform layer facilitates subsequent epitaxial regrowth after the formation of the current-confinement structure. This thin platform layer serves as a better substrate for epitaxial regrowth than the current-confinement layer would, because it is less prone to native oxidation during the ion implantation and other processing steps, and because any native oxide can be more easily removed from the current-spreading platform layer than from the current-confinement layer. Moreover, although the thin platform layer may also temporarily become more resistive due to the shallow ion implantation of the current-confinement layer, in an embodiment it may lose some or all of this enhanced resistivity when subjected to heat (e.g., from annealing or subsequent epitaxial regrowth).

The initial ion implantation into a material can enhance resistivity, e.g. by the implanted species and point defects trapping charge carriers, thus reducing the free carrier density. However, in some cases, depending on the type and extent of damage to the crystalline lattice of the material, the ion implantation can give rise to a leakage current, i.e. increased conductivity. After annealing repairs some or most of the damage, the leakage current may be reduced or eliminated, thus giving rise to an increased resistivity higher (i.e., reduced free carrier density) than before the ion implantation. In some implementations of the present invention, therefore, the initial ion implantation gives rise to an ion-implanted region which may not yet have the ultimate enhanced resistivity acquired after the subsequent annealing step. For example, the ion implantation may cause enough damage so that the leakage current either increases conductivity or offsets the free carrier-density reducing effects, so that there is either no or little change in resistivity, followed by a final enhancement of resistivity in the annealing step which stops the leakage. Or, for example, the resistivity of the material may increase partly after the ion implantation and to a further degree after the annealing. Or, in the first embodiments discussed above, the material may acquire an enhanced resistivity after the ion implantation, which is simply maintained (e.g., in the case of the current-confinement layer) after the annealing. In any event, in the present invention, ion implantation and subsequent annealing of the current-confinement layer gives rise to enhanced resistivity in the implanted region, while the same done to the current-spreading layers gives rise to either no or a lower degree of enhanced resistivity.

After the epitaxial growth of the first upper spacer layer, a patterned ion implant is performed to form the current-confinement structure. To do this, a mask (e.g., of $SiO_2$ or photoresist) is lithographically formed on the sample, and a relatively low energy, shallow ion implant is performed to form a patterned ion-implanted current-confinement structure or region in the current-confinement layer. A circular mask portion centered over the active region and desired location of the optical cavity causes ions to be implanted primarily in an annular portion of the current-confinement layer. The annular portion surrounds a substantially cylindrical center section having approximately the diameter of the circular mask portion and which is not subject to ion implantation, due to blocking by the mask. In this application, "annular" means a three-dimensional shape surrounding a center opening or section. This includes ring-shaped and torus or toroid-shaped regions, as well as a substantially cylindrical shape minus an interior, concentric substantially cylindrical shape. Other shapes are possible as well, e.g. square, rectangular, or elliptical shaped toroids.

The aperture bounded by the annular region is in an embodiment more or less cylindrical, with a substantially circular cross-section. In alternative embodiments, the aperture has other shapes, e.g. three-dimensional shapes with rectangular or elliptical cross-sections. An elliptical or rectangular cross-section may be employed, for example, to provide for a predetermined polarization of the laser output.

The resulting current-confinement structure thus has an annular resistive portion (annular region of enhanced resistivity) and a less-resistive substantially cylindrical current aperture. At this point, the first upper spacer layer comprises a current-confinement structure in the upper portion thereof (e.g., within the top one-third to one-fifth), with a thin platform layer on the top of this current-confinement structure. The current-confinement structure and platform layer sit atop the buffer layer, which is a comparatively thicker current-spreading portion.

In an embodiment, the sample is then thermally annealed to correct (repair) damage to the crystal lattice of the platform layer caused by the ion implantation. This annealing both repairs (or reduces) the damage to the platform layer, and, in an embodiment, may also remove or reduces any enhanced resistivity acquired by the platform layer during the ion implantation. The annealing also repairs damage done to the current-confinement layer, e.g. to reduce leakage.

The annealing step is followed, in an embodiment, by an epitaxial regrowth step to form the second upper spacer layer (i.e., additional or "top" current-spreading material regrown on top of the platform layer), to complete the composite upper spacer layer.

In an alternative embodiment, the separate annealing step is omitted, and the heat from the epitaxial regrowth itself is sufficient to repair damage to the platform layer and buffer layer. However, the heat from any separate annealing step and epitaxial regrowth will not eliminate the enhanced resistivity previously acquired by the current-confinement layer (or it will increase or give rise to enhanced resistivity), so that the current-confinement structure previously formed therein is maintained (or created). This ion-implantation step (including the subsequent annealing) results in a current-confinement structure within the upper spacer layer, in particular, within the current-confinement layer of the first upper spacer layer of the composite upper spacer layer.

Because the current-confinement layer is close to the top surface of the first upper spacer layer (lying within the upper one-third, at most, in an embodiment), a shallow ion implantation can be utilized. This allows the problems of limited precision and vertical and lateral straggle accompanying deep ion implantation to be ameliorated or reduced, and provides greater control over the aperture size. Additionally, because lower energies are employed, crystalline damage to the VCSEL is minimized. The use of the current-confinement layer allows the enhanced patterned insulation (i.e., the current-confinement structure) to be maintained even after further regrowth or annealing, and the use of the thin regrowth platform layer on top of the current-confinement layer provides a better regrowth substrate because oxidization problems are reduced. The formation of the remainder of the upper spacer layer by epitaxial regrowth after the ion implantation allows the current-confinement structure to be formed deep below the top of the composite upper spacer layer, but utilizing shallow instead of deep ion implantation.

Figure 1:
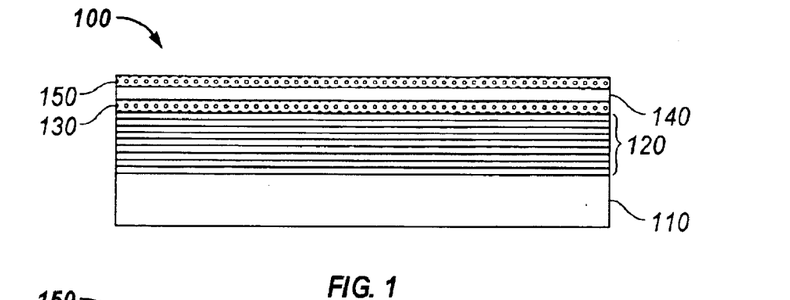
FIG. 1 is a cross-sectional view of the layer structure of a VCSEL after initial growth, in accordance with an embodiment of the present invention.

Referring now to FIG. 1, there is shown a cross-sectional view of the layer structure of a wafer sample during fabrication of VCSEL 100 at an early stage in the epitaxial growth process, in accordance with an embodiment of the present invention. Epitaxially grown layers of VCSEL 100 may be fabricated on a wafer substrate 110 with epitaxial growth techniques such as molecular beam epitaxy (MBE), liquid phase epitaxy (LPE), a vapor phase epitaxy (VPE) process such as or metalorganic chemical vapor deposition (MOCVD, also known as MOVPE), or other known crystal growth processes. Other layers may be deposited with non-epitaxial deposition techniques such as e-beam evaporation, thermal evaporation, or sputtering.

Substrate layer 110 consists of InP; other substrates may also be employed in alternative embodiments. The initial part of the VCSEL structure 100 is epitaxially grown on substrate 110 (preferably employing MBE) and consists of a bottom reflector 120, a bottom (lower) spacer layer 130, an active region 140, and a first upper or top spacer region or layer 150. The first upper spacer layer 150 will form the bottom part of a composite upper spacer layer (described in further detail below). Each layer of VCSEL 100 may itself comprise multiple layers of semiconductors of different composition and doping. A bottom metal contact (670 of FIG. 6) may be disposed on the back side of substrate 110, or, alternatively, elsewhere within the VCSEL structure, below active region 140 (e.g., on the side of a VCSEL mesa, on top of a surface of the current-spreading bottom spacer layer 130 outside the active region).

As will be understood, for purposes of conducting current of the appropriate type (i.e., holes or electrons), layers on the bottom side of the active region that need to conduct pumping current are typically doped with one type (e.g., n-type); layers on the top side of the active region that need to conduct pumping current are doped the other type (e.g., p-type). Thus, for example, substrate 110, bottom DBR 120, and bottom spacer 130 may be doped n-type, and current-conducting layers above active region 140, such as first upper spacer layer 150, may be doped p-type. The opposite doping scheme may be employed in other embodiments, or some layers may be undoped.

In an embodiment, bottom reflector 120 is a DBR consisting of multiple mirror pairs, each pair having layers of semiconductor having a crystal lattice constant close to the substrate, where the two layers of each pair have differing indices of refraction. In an embodiment, DBR mirror 120 has about 40 n-type $In_xGa_yAl_{1-x-y}As$/InP mirror pair layers. As will be appreciated, each layer of the mirror pairs of the DBR has a quarter-wave optical thickness (QWOT), for a given emission wavelength (for this reason, DBRs are sometimes referred to as semiconductor quarterwave stacks). In another embodiment, InGaAsP/InP or other mirror pair layers may be employed.

As an example, for a VCSEL designed to emit at or around 1550 nm (1.55 μm) light, the $In_xGa_yAl_{1-x-y}As$ (or InGaAsP, in an alternative embodiment) layers may be approximately 1122 Å thick and the InP layers may be approximately 1224 Å thick. This can yield a reflectivity of about 99.9%. In an embodiment, DBR 120 is about 9 μm thick. Lower spacer region 130, in an embodiment, is a single layer of n-type InP and, in alternative embodiments, may consist of multiple semiconductor layers. In an embodiment, lower spacer layer 130 is about 0.25 to 2 μm thick.

Active region 140, in an embodiment, comprises a structure such as multiple quantum wells (MQWs) which provide a gain spectrum suitable for emitting radiation at the desired wavelength, e.g. 1550 nm. Active region layer 140 may consist of a material such as (undoped) InGaAsP/InP (or InAlGaAs/InP) having, for example, eight (8) quantum wells (QWs). In an embodiment, active region 140 is about 0.1 to 0.2 μm thick.

As will be appreciated, an upper and/or lower spacer layer are used to help optimally position the active region 140 axially (vertically) within the cavity. For example, by selecting the appropriate thicknesses of upper and lower spacer layers, the active region 140 is optimally placed at a maximum in the axial mode's standing wave pattern to maximize gain. (Conversely, optically-absorptive (lossy) elements, such as heavily doped regions for metal contacts, are typically and preferably disposed at nulls in the standing wave pattern, where possible.) The upper and lower spacer layers preferably conduct both current and heat, and thus serve as current- and heat-spreading layers in addition to serving as spacing means. In the present invention, the upper spacer layer also comprises a current-confinement layer having a current-confinement structure.

Figure 5:
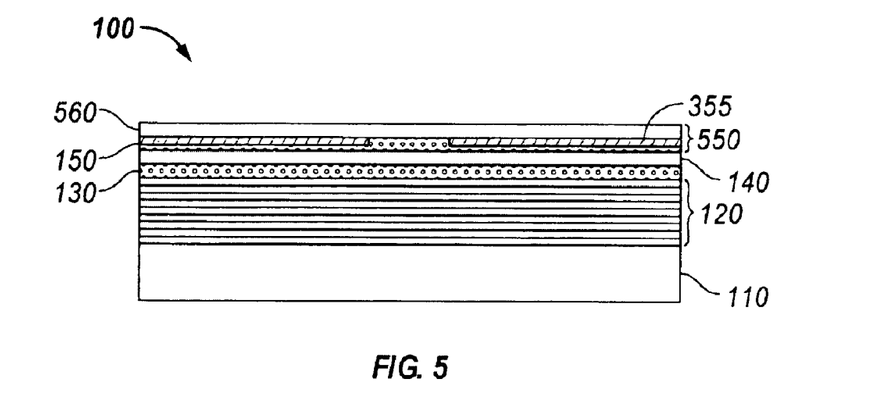
FIG. 5 is a cross-sectional view of the layer structure of the VCSEL of FIG. 1 after a regrowth step.

The first upper spacer layer portion 150 will form the first (bottom) part of a composite upper spacer layer (550, FIG. 5) situated between the active region 140 and an upper reflector (680, FIG. 6), where the composite spacer layer consists of the bottom part (i.e., the first upper spacer layer 150) and a top part (i.e. a second upper spacer layer 560, FIG. 5).

Figure 2:
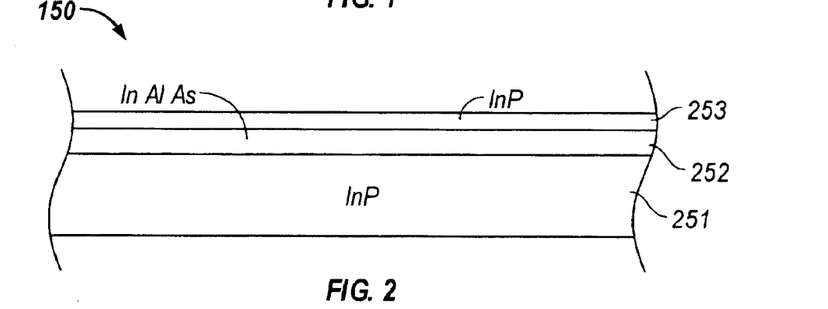
FIG. 2 is a cross-sectional view showing the layer structure of the first upper spacer layer of the VCSEL of FIG. 1 in further detail.

Referring now to FIG. 2, there is provided a cross-sectional view showing the layer structure of the first upper spacer layer 150 of VCSEL 100 in further detail. In an embodiment, first upper spacer layer 150 consists of multiple layers, as illustrated in FIG. 2. In an embodiment, a current-spreading buffer layer 251 (composed of p-type InP) is grown on active region 140, followed by growth of a thin p-type InAlAs current-confinement layer 252, followed by a thin p-type InP current-spreading platform layer 253. These layers are doped p-type as the current conductive layers below active region 140 are doped n-type in an embodiment. In alternative embodiments, the first upper spacer layer 150 may consist of other layers and materials. For example, instead of InP buffer layer 251 and InP platform layer 253, these layers may consist of other materials, such as InGaAs or InGaAsP. Thin current-confinement layer 252 preferably contains Al so that it receives and maintains an enhanced resistivity region to form the current-confinement structure. In an alternative embodiment, instead of InAlAs, InGaAlAs may be employed to form the current-confinement layer 252. In alternative embodiments, materials other than Al may be utilized to provide this characteristic.

Current-confinement layer 252 consists of a material that can acquire enhanced resistivity when subjected to ion implantation, and which can retain the enhanced resistance after being subjected to the heat of annealing and/or regrowth (described below). This permits the formation of a durable current-confinement structure in current-confinement layer 252. As described above, an aluminum-containing material, such as InAlAs, has such characteristics. However, layer 252 is not, in an embodiment, a suitable or preferred surface layer for epitaxial regrowth, because, due to the presence of Al in InAlAs, it is especially prone to native oxidization when subjected to air during the ion implantation and related lithographic and other processing steps, and it can be very difficult or impractical to remove the native oxide.

For example, removal of the native oxide may be impossible or may require an unacceptably high temperature process. InP, by contrast, is a semiconductor that is more suitable as a substrate or platform layer for epitaxial regrowth, because it is less prone to oxidization and it is easier to remove any native oxide on the InP surface before regrowth. This may be done, e.g. by heating the sample in a vacuum in the MBE chamber until the native oxide layer desorbs. As will be appreciated by those skilled in the art, during such a process, phosphorous is typically applied for temperatures >300° C., to prevent problems from incongruent sublimation of phosphorous. Other techniques may also be employed to remove the native oxide on the InP platform layer 253 surface, such as hydrogen plasma, in-situ etching, or in-situ cleaning.

Thus, in an embodiment, platform layer 253 serves as the regrowth platform or substrate onto which epitaxial regrowth can be done after the ion implantation processing and related steps. Without platform layer 253, InAlAs layer 252 would oxidize when removed from the growth chamber and exposed to air for the ion implantation step. Because it is difficult to remove oxide from InAlAs, the oxide on InAlAs layer 252 would inhibit regrowth thereon. However, the native oxide formed on the InP platform layer 253 during ion implantation can be removed. Therefore, because InP platform layer 253 is epitaxially fabricated on the current-confinement layer before removal from the growth chamber for ion implantation, its presence permits epitaxial regrowth of the second upper spacer layer on the first upper spacer layer.

Therefore, in an embodiment, the ion implantation occurs after the initial epitaxial growth, at which point the current-spreading platform layer 253, current-confinement layer 252, and current-spreading buffer layer 251 have been epitaxially grown on top of the active region. In an alternative embodiment, a cap or sacrificial layer of material may be epitaxially formed on top of platform layer 253 before the ion implantation step. This layer is removed, e.g. by etching, prior to the epitaxial regrowth on the platform layer, to assist in cleaning the surface. For example, the presence of this layer during part of the ion implantation processing may reduce the amount of native oxide that forms on the platform layer during the ion implantation processing and related steps. The cap layer may be composed of any of a variety of materials, such as InGaAs or InGAsP, and is preferably one that can be etched selectively relative to the platform layer. It may also be formed, e.g, of InP, the same material as that of the platform layer, in which case it is an initial extension of the platform layer which is removed by etching after the ion implantation and before regrowth. In this alternative embodiment, the cap layer is removed prior to regrowth, and thus the final structure does not include the sacrificial layer. After the removal of the cap layer, the now-exposed InP surface of the platform layer may be cleaned of any native oxide by desorption or other techniques mentioned above.

After epitaxial growth of the first upper spacer layer (buffer layer 251, current-confinement layer 252, and platform layer 253), the sample is then removed from the growth chamber and patterned, for example lithographically, with a patterned mask designed to facilitate selective ion implantation. A patterned current-confinement structure is formed in current-confinement layer 252 by ion implantation of species (elements) that make the material resistive. The ion implantation is performed in conjunction with the patterned mask.

Figure 3:
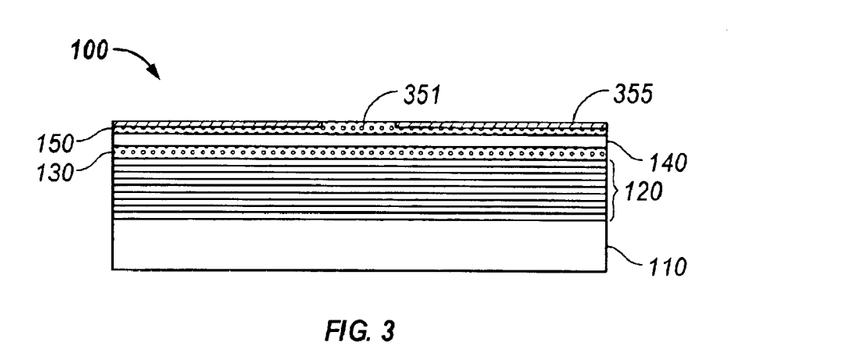
FIG. 3 is a cross-sectional view of the layer structure of the VCSEL of FIG. 1 after the current-confinement layer and aperture are formed.
Figure 4:
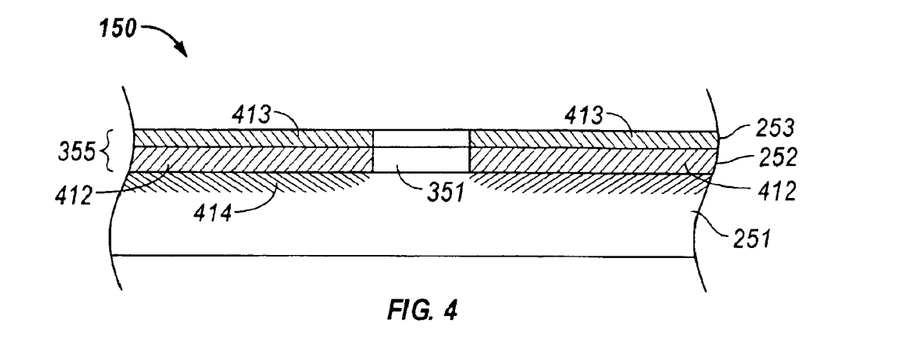
FIG. 4 is a cross-sectional view showing the layer structure of the first upper spacer layer of the VCSEL at the fabrication stage depicted in FIG. 3 in further detail.

Referring now to FIGS. 3 and 4, there are shown cross-sectional views of the layer structure of VCSEL 100 of FIG. 1, after a current-confinement structure 351 is formed. As shown in the more detailed view of FIG. 4, current-confinement structure 351, which has a current aperture 351, is formed by implanting annular region 412 of current-confinement layer 252 with ions. A patterned mask is used along with ion implantation to achieve a patterned ion implantation, so as to form a current-confinement structure. The patterned mask is preferably lithographically placed having circular section over where cylindrical aperture 351 is to be formed. The circular mask section and cylindrical aperture 351 are centered on the active region and transverse optical cavity.

Because current-confinement layer 252 is at the top of buffer layer 251 and only has a thin platform layer 253 on top, a relatively low ion energy can be employed to perform a shallow ion implant to implant selected regions within current-confinement layer 252. Preferably, because current aperture 351 has to conduct current and because the material of current-confinement layer 252 may not be as good a current conductor as the material of the surrounding current-spreading layers 251, 253, current-confinement layer 252 is selected to be as thin as possible while still having enough enhanced resistivity in the ion implanted regions to form a suitable current-confinement structure 412, i.e. enough enhanced resistivity to block a sufficient percentage of the pumping current and force it through the aperture. In an embodiment, current-confinement layer 252 is about 250 Å to 3000 Å thick.

Platform layer 253 is also as thin as possible so that lower ion energy can be used to ion implant the current-confinement layer 252 beneath the platform layer. For example, platform layer 253 may be about 250 Å to 1000 Å.

Current guided through aperture 351 will begin to spread out laterally as soon as it passes through aperture 351, through current-spreading buffer layer 251 and also through the layers of active region 140. The actual portion of the active region pumped by current will be the region of optical gain, and will give rise to a transverse optical mode of a similar diameter. As will be understood, this optical gain region should be no greater than the diameter of the top DBR, and preferably somewhat smaller than the top DBR. However, the region of optical gain is wider than the aperture 351, because of the spreading out of current guided through aperture 351. The greater the axial distance between aperture 351 and active region 140, the wider the transverse optical mode will be. To more precisely control the ratio between the size of the aperture 351 and the transverse optical mode, and/or to achieve a smaller optical gain region size, it is desirable for this axial distance to be minimized. Thus, buffer layer 251 is as thin as possible so that current aperture 351 is axially closer to the active region 140, to achieve optimum control of active region and optical gain size. However, buffer layer 251 must be thick enough to protect the active region 140 from damage from the ion implantation. There is typically significant ion straggle beyond the implantation region for two or three times the penetration depth. If significant ion straggle reaches active region 140, it can damage the active region, causing intermixing or disorder or the quantum wells, i.e. shifts in the quantum well energy which detrimentally affect laser operation. For example, such straggle-damage can result in changes in the lasing wavelength and significant reduction in lasing efficiency. An active region having such damage may be referred to as an ion implantation straggle-damaged region. Conversely, an active region far enough away from the penetration depth so that it is negligibly affected by any straggle, i.e. its operation and quantum wells are not substantially affected, may be referred to as an active region not substantially damaged by ion implantation straggle.

Thus, to ensure that the ion implantation of current-confinement layer 252 does not reach and thus damage active region 140, buffer layer 251 is preferably at least about two to about four times the thickness of the penetration depth of the ion bombardment. The ion implantation must penetrate through the thin platform layer and into the current-confinement layer below. Thus, the penetration depth is approximately the thickness of the top two layers 253, 252 together (which is approximately equal to the thickness of current-confinement layer 252, because platform layer 253 is comparatively much thinner). Accordingly, buffer layer 251 preferably has a thickness at least about two to four times as thick as current-confinement layer 252 plus platform layer 253. Thus, current-confinement layer 252 preferably is disposed within approximately the upper one-third to one-fifth portion of the first upper spacer layer 150. In an alternative embodiment, current-spreading layer preferably has a thickness at least equal to that of current-confinement layer 252 plus platform layer 253, in which case current-confinement layer 252 is disposed within approximately the upper half of the first upper spacer layer 150.

Ion implantation is performed with a penetration selected so that annular region 412 is ion implanted in current-confinement layer 252 and thus becomes more resistive (insulating). Because current-confinement layer 252 is so close to the top of spacer layer 150 (e.g., in its upper one-third, in an embodiment) and platform layer 253 is relatively thin in comparison to layer 252, the shallow ion implantation will also generate an annular ion implanted region 413 in platform layer 253. This region also has enhanced resistivity; however, after annealing and/or epitaxial growth heat is applied to the sample, region 413 will disappear or diminish as the normal conductivity of platform layer 253 is restored. There will be ion straggle for some depth into buffer layer 251, as indicated by region 414. As noted above, there is typically ion straggle beyond the implantation region for two or three times the penetration depth, gradually tapering out, and virtually nonexistent by the time the bottom of buffer layer 251, and thus active region 140, is reached. However, any enhanced resistivity in region 414 will also be reversed in the subsequent heat during annealing or epitaxial regrowth, so that region 414, like region 413 (and unlike region 412), is only temporary as well.

An ion energy and species are selected to achieve an ion depth and penetration covering current-confinement layer 252 to form annular ion-implanted, enhanced resistivity region 412. For example, an ion species such as oxygen, hydrogen, helium, iron, titanium, chromium, boron, nitrogen, silicon, or ruthinium may be employed. The ion energy is selected to have a shallow implant in which the penetration of ions into the first upper spacer layer 150 is confined to the platform layer 253 and current-confinement layer 252. This penetration depth or implant range (i.e. location of the peak ion implantation, roughly near the center or bottom of the current-confinement layer) can range, for example, from about 200 Å to about 5000 Å (Angstrom), depending on the combined thickness of the two top layers 252 and 253. A low penetration depth is achieved with a combination of the choice of ion species, such as oxygen, and low ion energy, e.g. on the order of 10–200 keV. In an embodiment, the implant energy is less than 400 keV. For example, if current-confinement layer 252 is about 1000 Å thick and platform layer 253 is 250 Å, then an ion species of oxygen and ion energy of about 70 keV may be employed to achieve a penetration depth of about 1250 Å (the total thickness of current-confinement layer 252 and platform layer 253). Ion straggle will lead to some implantation about 3000 Å into buffer layer 251, thus forming region 414. For an oxygen species, a dose sufficient to enhance the resistivity of annular region 412 relative to cylindrical aperture 351 to the desired degree is employed. For example, in an embodiment, it is desired that the great majority (e.g., at least 70%, or, in alternative embodiments, other thresholds, such as 90%) of current from contact 675 (FIGS. 6, 7) flow through aperture 351 instead of through annular region 412. To achieve a desired ratio of current flowing through aperture 351 relative to that flowing through annular region 412, the resistivity of annular region 412 needs to be a certain degree higher than that of aperture 351. In an embodiment, the resistivity of region 412 is at least about 50 times (or, in alternative embodiments, other ratios, such as 100 times) that of aperture 351. As will be appreciated, the amount of enhanced resistivity acquired by a region 412 bombarded by ions depends on the species and energy employed, the species dosage, the material employed for the region and its non-implanted resistivity, the thickness of the layer and penetration depth, and related implementation details. In an embodiment, oxygen ions in the range of about $2 \times 10^{12}/cm^2$ to about $5 \times 10^{13}/cm^2$ may be employed. In alternative embodiments, oxygen doses even lower than $2 \times 10^{12}/cm^2$ may be employed, so long as sufficient enhanced resistivity of region 412 is achieved.

In general, the current-confinement layer must have an enhanced resistivity sufficiently greater than that of the central aperture so that the desired percentage of the pumping current (e.g., most of the pumping current; or 70% of the pumping current, e.g.) from the metal contact conducted through the top current-spreading layer and platform layer is blocked by the annular region and forced through the central aperture. Thus, the annular region preferably has sufficient thickness (for a given area and resisitivity, e.g.), ion implantation, etc., to achieve the desired blocking effect.

Thus, after the shallow ion implantation, only the topmost portion of first upper spacer layer 150 has been ion implanted. In particular, an ion-implanted annular current-confinement structure 412 is formed in current-confinement layer 252, having a cylindrical center aperture 351. Aperture 351 is a substantially cylindrical portion of layer 252 that has not been changed to an insulating region (because the mask blocks ion bombardment in this region), and acts as a current aperture for channeling or guiding current into the active region. Also, at this point, annular region 413 of platform layer 253 and annular region 414 of buffer layer 251 have also been formed having enhanced resistivity and also some damage due to the ion implantation.

The sample may then be re-introduced into the MBE chamber, where any native oxide formed on platform layer 253 may be removed by suitable techniques, such as heat-induced desorption, hydrogen plasma, in-situ etching, or in-situ cleaning.

Heat is also applied to remove the damage to the crystalline lattice structure of platform layer 253. This either partly or completely restores its original conductivity, so that it can better conduct current laterally, through aperture 351, and also facilitates subsequent epitaxial grown on platform layer 253. The heat used to repair damage to platform layer 253 may be used to simultaneously remove native oxide, or these may be separate steps. In one embodiment, an annealing process is utilized, in which the sample is heated (and, in some annealing techniques, slowly cooled) to reverse some or all of the lattice damage resulting from ion implantation. Subsequent epitaxial regrowth is then performed on the annealed platform layer. Annealing typically utilizes heat of 450° C. to 700° C., depending on the materials to be annealed, the damage to be repaired, and related details of a particular embodiment and application.

However, a regrowth step typically requires temperatures in excess of 400° C., which may be sufficient to anneal some materials, such as InP. As seen in M. C. Ridgway et al., *Appl. Phys. Lett.*, vol. 60, no. 24, pp. 3010–3012 (1992), implantation into p-type InP with oxygen ions strongly increases the resistivity of the layer, but subsequent annealing at temperatures greater than 400° C. substantially reduces the enhanced resistance of the layer, i.e. substantially restores its original conductivity. Thus, in another embodiment, e.g. in which platform layer 252 consists of InP, no separate annealing step is performed, since the heat from the epitaxial regrowth is sufficient to reverse the lattice damage and restore the material's original conductivity, and also to repair some of the damage done to the current-confinement layer 252 in structure 412. In this alternative embodiment, the regrowth itself serves as the annealing step or process. In embodiments in which the heat of epitaxial regrowth is used to perform annealing, the removal of the native oxide is preferably performed separately and prior to the regrowth, so that the epitaxial regrowth is done using a clean platform layer substrate.

For the same reason that a regrowth step can perform annealing of InP, in an embodiment InP is not employed as the material used for forming current-confinement layer 253. Otherwise, it would anneal during regrowth and current-confinement structure 414 would not survive. In one embodiment, $In_xAl_{1-x}As$ (x=0.52) is used as the current-confinement layer 253. Whether a separate annealing step or a regrowth annealing is employed, the annealing does not significantly reverse the enhanced resistivity of current-confinement region 412, and may actually further increase the resistivity of current-confinement region 412.

Referring now to FIG. 5, there is shown a cross-sectional view of the layer structure of VCSEL 100 of FIG. 1 after an initial epitaxial regrowth step. In this step, additional p-type InP current-spreading layer 560 is epitaxially grown on top of platform layer 253. This top current-spreading layer 560 is, or is part of, the second upper spacer layer which, combined with first upper spacer layer 150, forms composite upper spacer layer 550. In an embodiment, platform layer 253 has a planar surface, thus providing better control of the epitaxial regrowth is possible than otherwise, because it prevents non-uniform mass transport on the surface and shadowing effects during the epitaxial regrowth. In an alternative embodiment, platform layer 253 may have a slightly non-planar surface instead of a more planar (from an epitaxial crystalline structure point of view) surface.

After growth of layer 560, InP current-spreading layers 560, 253, and 251 form the bulk of composite upper spacer layer 550. Current-confinement layer 252, which contains the current-confinement structure 412, is sandwiched between current-spreading layers 560, 251 and also is part of upper spacer layer 550, but a comparatively small part. Thus, upper spacer layer 550 has current-spreading layers with a current-confinement structure 412 disposed between them. In particular, current-confinement layer 252 (and current-confinement structure 412) is disposed between a lower current-spreading layer (i.e., buffer layer 251) and an upper current-spreading layer (i.e., a composite upper current-spreading layer comprising platform layer 252 and top current-spreading layer 560). As noted above, buffer layer 251 preferably has a thickness at least about two to four (e.g., about three) times as thick as current-confinement layer 252 plus platform layer 253. However, because top current-spreading layer 560 is substantially thicker than either platform layer 253 or current-confinement layer 252 (or both of them together), and because buffer layer 251 is preferably as thin as possible while satisfying the buffer thickness requirements, buffer layer 251 also has a thickness less than about about two to four (e.g., about three) times as thick as current-confinement layer 252 plus platform layer 253 plus top current-spreading layer 560.

As shown in FIG. 5, during the regrowth step, second upper spacer/current-spreading layer 560, preferably composed of InP, is first grown on first upper spacer layer 150 (in particular, on platform layer 253). Together, layer 560 and platform layer 253 form a current-spreading layer which guides current laterally from a metal contact (675 of FIG. 7), through aperture 351. These layers together must be sufficiently conductive to conduct pumping current from the metal contact laterally through the combined top current-spreading layer 560 and platform layer 253 to the central aperture of the current-confinement structure. For example, given a certain conductivity, cross-sectional area, thickness of the first upper spacer layer, aperture size, annular region 412 resistance, and other factors, layer 560 must have the appropriate thickness so as to provide a conductivity sufficient to conduct pumping current from the metal contact laterally through the combined top current-spreading layer and platform layer to the central aperture of the current-confinement structure.

Accordingly, the present invention provides a method for fabricating a surface-emitting laser having current confinement. A first laser portion having a substrate 110, an active region 140, and a bottom mirror 120 disposed between the substrate and the active region is provided. A bottom spacer layer 130 may also be provided between the bottom mirror and the active region. Next, a first top spacer layer 150 is epitaxially grown on the active region. This layer comprises a comparatively thick current-spreading buffer layer 251 disposed on the active region, a comparatively thin current-confinement layer 252 disposed on the comparatively thick current-spreading layer, and a current-spreading platform layer 253 disposed on the current-confinement layer. The combined thickness of the platform and current-confinement layers (253, 252) is less than the thickness of the comparatively thick buffer layer 251 and, in an embodiment, this combined thickness is not more than one-third or one-fifth the thickness of the comparatively thick buffer layer 251. After this epitaxial growth of the first top spacer layer, a current-confinement structure having an annular region 412 of enhanced resistivity and a central aperture 351 of comparatively lower resistivity is formed in the current-confinement layer 252 by ion implantation. Subsequently to this ion implantation step, an epitaxial regrowth is performed to form a second top spacer layer 560 on the platform layer 253.

Figure 6:
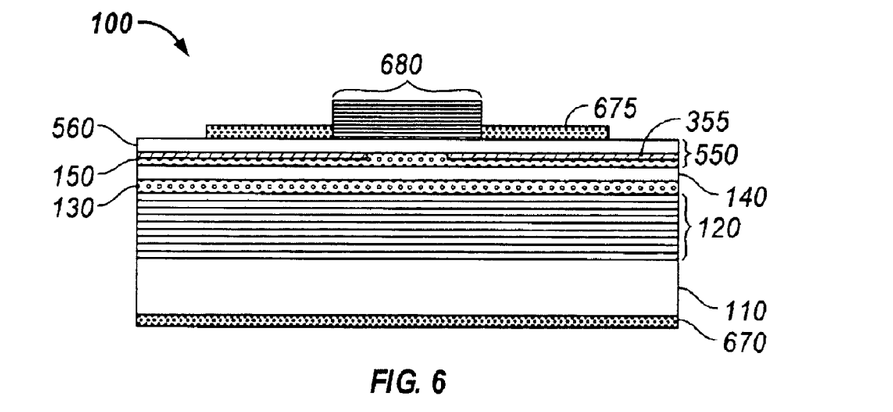
FIG. 6 is a cross-sectional view of the layer structure of the VCSEL of FIG. 1 after further fabrication steps including deposited metal and dielectric layers.
Figure 7:
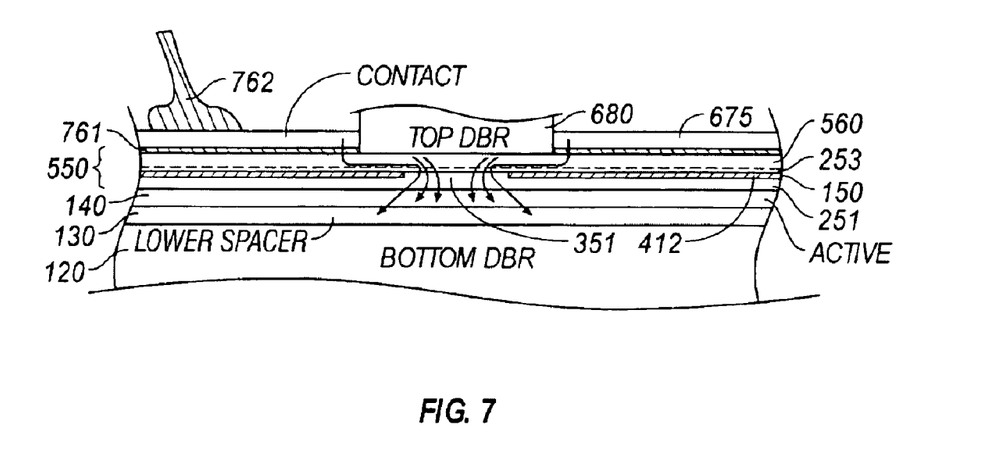
FIG. 7 is a cross-sectional view showing in further detail part of the layer structure of the VCSEL at the fabrication stage depicted in FIG. 6.

Additional epitaxial regrowth and deposition steps are also performed, e.g. to grow a contact-facilitating layer and a dielectric DBR to form a top mirror for the VCSEL. In an alternative embodiment, the top mirror is a semiconductor DBR, or a composite DBR having both semiconductor and dielectric portions. Referring now to FIG. 6, there is shown a cross-sectional view of the layer structure of the VCSEL of FIG. 1 after further fabrication steps including deposited metal and dielectric layers. FIG. 7 is a cross-sectional view showing in further detail part of the layer structure of VCSEL 100 at the fabrication stage depicted in FIG. 6.

First, a contact-facilitating layer 761 is formed on or in current-spreading layer 560. This is a layer suitable for bonding with a metal contact, in that it has a lower contact resistance with the metal contact. Contact-facilitating layer 761 may be on the order of thickness as platform layer 253, and in an embodiment is about 250 Å to 500 Å thick. A metal contact layer, which will become annular metal contact 675 after patterned liftoff, is deposited on top of contact-facilitating layer 761. In an embodiment, contact-facilitating layer 761 is epitaxially regrown on top of current-spreading layer 560. In an embodiment, layer 761 consists of a doped InGaAs layer for electrical contact (with a doping density of about $5\times10^{19}/cm^3$). Such a material has a much lower contact resistance with the metal contact 675 than InP layer 560 would have. In alternative embodiments, contact-facilitating layer 761 is formed on or in current-spreading layer 560 with non-epitaxial techniques, such as deposition; diffusing a dopant into a top portion of current-spreading layer 560; or with rapid thermal annealing processes during the metallization process in which metal contact 675 is deposited, in which the metal of contact 675 diffuses into or intermixes with the semiconductor material at the top of current-spreading layer 560, thereby enabling the formation of a low resistance ohmic contact. In this latter approach, the rapid thermal annealing causes the metal and semiconductor to intermix in a region under the metal contact. In this case, the intermixed layer at the boundary of and between the semiconductor current-spreading layer 560 and the metal contact 675 may be considered to be an intermediate contact-facilitating layer between the metal contact and the layer 560.

Next, a cylindrical opening is formed into layers 675 and 761, e.g., by liftoff of metal from metal contact layer 675 and by etching into contact-facilitating layer 761, so that the top DBR 680 may be deposited. This opening is centered on the transverse optical cavity and the aperture 351. Then, a dielectric top DBR 680 is deposited, having several mirror pairs. Depending on the application, various types of mirror pair materials may be employed, such as $SiO_2/Ta_2O_5$ or $Si/SiO_2$. Top mirror 680 is disposed axially above the composite upper spacer layer 550 (and thus above the first upper spacer layer portion 150), either directly on the top surface of composite upper spacer layer 550 (e.g., the top surface of second upper spacer layer 560, in the embodiment shown in FIG. 5), or on top of some layer itself above the composite upper spacer layer 550. I.e., top mirror 680 is disposed axially above the composite upper spacer layer 550, either with or without intervening layers between.

A probe or wire bond 762 may be electrically coupled to annular metal contact 675, to provide pumping current to VCSEL 100. In an embodiment, the diameter of the annular metal contact 675 (at its outer, circular edge) is about 15 μm; the diameter of the inner circular edge of metal contact 675 and the diameter of top DBR 680 is about 5–7 μm; the diameter of aperture 351 is about 3 μm. Other sizes may be used in other embodiments and applications.

A bottom metal contact 670 is also disposed on the bottom of substrate 110. Thus, contacts 675, 670 provide electrical contacts above and below, respectively, active region 140. In an alternative embodiment, bottom contact 670 is disposed on the top side of the substrate using an etch to open a contact to a conductive layer below the active region.

When a pumping current is applied to the VCSEL from an external pumping current source (not shown), by means of a wire bond or probe 762 electrically coupled to the upper surface of metal contact 675, the current flows down through annular metal contact 675, through contact-facilitating layer 761 and then laterally through current-spreading layers 560 and 253 toward the center of the VCSEL structure, and down through the aperture 351, as indicated by curved arrows in FIG. 7. After exiting from aperture 351, the current begins to spread out laterally into current-spreading buffer layer 251 of upper spacer 150 and into active region 140. The closer aperture 351 is to active region 140, the smaller will be the optical gain region (i.e., the portion of active region layer 140 pumped by the guided pumping current). The axial placement of aperture 351 with respect to active region 140 is selected so that the optical gain region has a diameter about equal to the diameter of the desired transverse optical mode (within the optical cavity), which is less than the diameter of top DBR 680 in an embodiment. The diameter of the optical gain region is thus larger than that of aperture 351 but smaller than it would be if aperture 351 were axially farther away from the active region.

In prior art techniques, in which higher energy, deep implants are employed, the damage is buried below the surface and the top semiconducting layers are still conducting. In the present invention, by contrast, a low ion implant energy is used to perform a shallow ion implant, to improve the control of the lateral and vertical dimensions of the insulating (resistive) region 412, and to minimize the overall damage to the structure. Although region 413 of platform layer 253 will also have acquired enhanced insulation due to the ion bombardment, insulating region 413 is removed by reversing the enhanced resistivity of layer 253, when heat is subsequently applied. By contrast, in prior art techniques, such as that described in Chirovsky et al., U.S. Pat. No. 6,169,756 B1, the layers of current-spreading material above the region to be ion-implanted do not acquire enhanced resistivity, and thus do not require annealing to become conducting once more; however, in this case the upper layers do not require such annealing because the ion-implanted region or zone is deeper and a higher implantation energy is employed, which prevents the top layers from becoming implanted.

In an embodiment, the following parameters and design choices may be employed: Oxygen is employed as the ion species, and a low ion energy of about 40 keV is employed during the ion implantation step. The VCSEL structure has the following parameters at the ion implantation stage: cap layer: 200 Å; InP current-spreading platform layer 253: 500 Å; InAlAs current-confinement layer 252: 500 Å; current-spreading buffer layer 251: 3500 Å (i.e., roughly three (2.92) times the combined thickness of the cap layer, platform layer 253, and current-confinement layer 252). After the ion implantation, the cap layer is removed and top current-spreading layer 560 (10,000 Å) and contact-facilitating layer 761 (500 Å) are regrown on top of the platform layer 253, and contact layer 675 is formed on contact-facilitating layer 761. After forming a cylindrical opening into layers 675 and 761 to expose a circular surface of top current-spreading layer 560 (surrounded by annular metal contact 675), top DBR 680 is deposited on this surface.

Alternative Embodiments

In alternative embodiments, a single layer or other multi-layer embodiments for layer 150 may be employed.

In embodiments described above, a regrowth step follows the ion implantation. This permits the initial ion implantation to be shallow and use less implantation energy than deep implantation approaches. The use of the thin platform layer on top of the current-confinement (implanted) layer helps to address the problem that the current-confinement layer would normally oxidize during implantation too much to permit acceptable regrowth thereon. However, in an alternative embodiment, the use of the platform layer may be avoided. For example, if the sample is maintained in a vacuum or other controlled environment from regrowth chamber, to implantation and related processing, back to regrowth chamber, oxidization will be reduced, and thus the platform layer may not be required, in some applications. Or, a material suitable for serving as a current-confinement layer but which does not oxidize excessively may be employed instead of InAlAs. Alternatively, a material such as InAlAs may be employed without a covering platform layer, so long as a suitable technique to clean the oxide from the surface of the current-confinement layer is employed, such as using hydrogen plasma or very high temperature desorption. In these alternative embodiments, the epitaxial regrowth takes place by regrowing further current-spreading layer directly on the top surface of the current-confinement layer.

In the embodiments described above, the platform layer serves a part of the current-spreading layer on top of the current-confinement structure of the upper spacer layer, and the regrown current-spreading layer forms the bulk of that top current-spreading layer. A contact-facilitating layer 761 is formed on top of the top current-spreading layer. The current-spreading layers above the current-confinement structure (i.e., the combination of regrown current-spreading layer 560 and platform layer 253) are necessary to guide current laterally from a contact layer (675 of FIG. 7), through aperture 351. However, in an alternative embodiment, there is no regrown current-spreading layer 560. Instead, a contact-facilitating layer 761 is formed directly on the thin platform layer 253. In such embodiments, contact-facilitating layer 761 may be formed directly on platform layer 253 either before or after the ion implantation. If formed before the ion implantation, it may be epitaxially grown or formed in accordance with other techniques. If formed after, it may be epitaxially regrown or formed by techniques other than epitaxial growth, as described above. If contact-facilitating layer 761 is formed directly on platform layer 253 before the ion implantation, then the ion implantation has to pass through both contact-facilitating layer 761 and platform layer 253 to implant region 412 into current-confinement layer 252. In this case, the buffer layer 251 is comparatively thick relative to the combined thickness of layers 761, 253, and 252. For example, in an embodiment in which layer 761 is formed before ion implantation, buffer layer 251 is at least as thick as the combined layers 761, 253, and 252. In another such embodiment, buffer layer 251 is at least about two to about four times as thick as the combined layers 761, 253, and 252. If contact-facilitating layer 761 is formed directly on platform layer 253 after the ion implantation, then the buffer layer 251 is comparatively thick relative to the combined thickness of layers 253 and 252. For example, in an embodiment in which layer 761 is formed after ion implantation, buffer layer 251 is at least as thick as the combined layers 253 and 252. In another such embodiment, buffer layer 251 is at least about two to about four times as thick as the combined layers 253 and 252.

In embodiments in which there is no regrown current-spreading layer 560 and contact-facilitating layer 761 is formed directly on the thin platform layer 253, the contact-facilitating layer 761 and thin current-spreading platform layer 253 suffice to transport current from metal contact 675 laterally to aperture 351. In this case, the platform layer 253 has to have sufficient conductivity (along with the conductive material of contact-facilitating layer 761) to spread current laterally to aperture 351. E.g., platform layer 253 must be thick enough to achieve the desired conductivity, but is still thin enough so that the top portion of the first upper spacer layer (that comprising the current-confinement layer and the platform layer, and also the contact-facilitating layer in embodiments in which it is formed before ion implantation), lies in the upper one-third to one-fifth, at most, of the first upper spacer layer. This permits a shallow ion implant and low implant energy (e.g., not exceeding 200 keV, in an embodiment) to be employed, thereby minimizing vertical and lateral straggle and the problems of limited precision and locations accompanying deep ion implantation. In one such embodiment, an ion species, such as oxygen, and low ion energy, e.g. on the order of 10–200 keV, is employed, with upper spacer layers having the following approximate thicknesses: current-spreading platform layer 253: 1000 Å; current-confinement layer 252: 500 <; current-spreading buffer layer 251: 4500 Å (i.e., about two to four times the combined thickness of platform layer 253 and current-confinement layer 252). In alternative embodiments, current-spreading buffer layer 251 is no greater than 10,000 Å, or 5000 Å, 3000 Å, 2000 Å, or some other suitable threshold. Contact-facilitating layer 761, regrown on top of the upper spacer layer, may be about 250 Å thick. In an alternative embodiment, the top portion of the first upper spacer layer (that comprising the current-confinement layer and the platform layer, and also the contact-facilitating layer in embodiments in which it is formed before ion implantation) lies in the upper half, at most, of the first upper spacer layer.

In VCSEL 100 (FIG. 6, for example), the top mirror 680 is the exit mirror and light is emitted "upward" out of the VCSEL. In alternative embodiments, a different VCSEL structure may be employed in which the light is emitted downward through the bottom mirror which is the exit mirror.

In the present application, a "non-section-112(6) means" for performing a specified function is not intended to be a means under 35 U.S.C. section 112, paragraph 6, and refers to any means that performs the function. Such a non-section-112(6) means is in contrast to a "means for" element under 35 U.S.C. section 112, paragraph 6 (i.e., a "section-112(6) means"), which literally covers only the corresponding structure, material, or acts described in the specification and equivalents thereof.

The present invention, therefore, is well adapted to carry out the objects and attain the ends and advantages mentioned, as well as others inherent therein. While the invention has been depicted and described and is defined by reference to particular preferred embodiments of the invention, such references do not imply a limitation on the invention, and no such limitation is to be inferred. The invention is capable of considerable modification, alteration and equivalents in form and function, as will occur to those ordinarily skilled in the pertinent arts. The depicted and described preferred embodiments of the invention are exemplary only and are not exhaustive of the scope of the invention. Consequently, the invention is intended to be limited only by the spirit and scope of the appended claims (if any), giving full cognizance to equivalents in all respects.

What is claimed is:

1. A method for fabricating a surface-emitting laser having current confinement, the method comprising the steps of:
   (a) providing a first laser portion having a substrate, a semiconductor active region, and a bottom mirror disposed between the substrate and the active region;
   (b) epitaxially growing a first top spacer layer on the active region, the first top spacer layer comprising a current-spreading buffer layer disposed on the active region, a current-confinement layer disposed on the buffer layer, and a current-spreading platform layer disposed on the current-confinement layer, wherein the combined thickness of the platform and current-confinement layers is less than the thickness of the buffer layer;
   (c) forming, in the current-confinement layer, a current-confinement structure having an annular region of enhanced resistivity and a central aperture of comparatively lower resistivity, said step of forming comprising the step of performing ion implantation; and
   (d) after said forming of the current-confinement structure, performing epitaxial regrowth to form a top current-spreading layer.

2. The method of claim 1, wherein the surface-emitting laser is a vertical-cavity surface-emitting laser designed to emit coherent light having a wavelength of about 1550 nm.

3. The method of claim 1, wherein said platform layer and said substrate consist of InP and said current-confinement layer consists of one of InAlAs and InGaAlAs.

4. The method of claim 1, farther comprising the step of forming a top mirror disposed axially above the first top spacer layer to complete a resonant cavity surrounding the active region.

5. The method of claim 4, wherein the top mirror is a DBR having a plurality of mirror pairs.

6. The method of claim 5, wherein the DBR is a dielectric DBR having a plurality of dielectric mirror pairs, wherein said step of forming said dielectric DBR comprises the step of depositing said dielectric mirror pairs.

7. The method of claim 5, wherein the DBR is a semiconductor DBR having a plurality of semiconductor mirror pairs, wherein said step of forming said semiconductor DBR comprises the step of epitaxially regrowing said semiconductor mirror pairs.

8. The method of claim 1, further comprising the step of:
   (e) forming a metal contact on the laser so that the metal contact is electrically coupled with the top current-spreading layer, wherein:
      the top current-spreading layer and the platform layer together are sufficiently conductive to conduct pumping current from the metal contact laterally through the combined top current-spreading layer and platform layer to the central aperture of the current-confinement structure; and
      the annular region has an enhanced resistivity sufficiently greater than that of the central aperture so that at least about 70% of the pumping current from the metal contact conducted through the top current-spreading layer and platform layer is blocked by the annular region and forced through the central aperture.

9. The method of claim 8, further comprising the step of forming a top mirror disposed axially above the first top spacer layer to complete a resonant cavity surrounding the active region.

10. The method of claim 9, wherein the top mirror is a DBR having a plurality of mirror pairs.

11. The method of claim 9, wherein the surface-emitting laser is a vertical-cavity surface-emitting laser designed to emit coherent light having a wavelength of about 1550 nm.

12. The method of claim 8, further comprising the step of:
   (f) forming a contact-facilitating layer on the top current-spreading layer by performing epitaxial regrowth
   wherein step (e) comprises the step of forming the metal contact on the contact-facilitating layer, whereby the metal contact is electrically coupled with the top current-spreading layer via the contact-facilitating layer.

13. The method of claim 8, wherein the resistance of the annular region to the pumping current conducted through said top current-spreading layer and said platform layer from the metal contact is sufficiently greater than the resistance of the central aperture to said pumping current so that most of said pumping current flows through the central aperture.

14. The method of claim 13, wherein the resistance of the annular region to the pumping current is at least about 50 times greater than the resistance of the central aperture to said pumping current.

15. The method of claim 13, wherein at least 70% of the pumping current flows through the central aperture instead of through the annular region of enhanced resistivity.

16. The method of claim 8, wherein said platform layer consists of InP.

17. The method of claim 16, wherein said substrate consists of InP and said current-confinement layer consists of one of InAlAs and InGaAlAs.

18. The method of claim 16, wherein:
the active region has InGaAsP/InP layers and comprises a plurality of quantum wells which provide a gain spectrum suitable for emitting radiation at a desired wavelength; and
the bottom mirror is a semiconductor DBR having a plurality of semiconductor mirror pairs.

19. The method of claim 8, wherein:
electrically-conducting semiconductor layers below the active region are doped to have a first conductivity type and electrically-conducting semiconductor layers above the active region are doped to have a second conductivity type opposite to the first conductivity type;
the first laser portion further comprises a bottom spacer layer disposed between the active region and the bottom mirror, the bottom mirror is a bottom semiconductor DBR;
the electrically-conducting semiconductor layers below the active region comprise the substrate, the bottom DBR, and the bottom spacer; and
the electrically-conducting semiconductor layers above the active region comprise the first top spacer layer, and the top current-spreading layer.

20. The method of claim 1, wherein said platform layer consists of InP.

21. The method of claim 1, wherein the first laser portion further comprises a bottom spacer layer disposed between the active region and the bottom mirror.

22. The method of claim 1, wherein said ion implantation of step (c) employs an implant energy of less than 400 keV.

23. The method of claim 22, wherein said ion implantation of step (c) employs oxygen as an implanted species.

24. The method of claim 23, wherein the resistance of the annular region to current conducted through said top current-spreading layer and said platform layer is sufficiently greater than the resistance of the central aperture to said current so that at least about 70% of said current flows through the central aperture.

25. The method of claim 1, wherein the resistance of the annular region to current conducted through said top current-spreading layer and said platform layer is sufficiently greater than the resistance of the central aperture to said current so that at least about 70% of said current flows through the central aperture.

26. The method of claim 1, wherein the combined thickness of the platform and current-confinement layers is less than one-third of the thickness of the buffer layer.

27. The method of claim 1, wherein:
the substrate and layers disposed thereon are part of a wafer sample;
said step (d) further comprising the step of thermally annealing the sample, after said ion implantation, to correct damage to the crystal lattice of the platform layer caused by said ion implantation.

28. The method of claim 1, wherein:
the substrate and layers disposed thereon are part of a wafer sample; and
the epitaxial regrowth of step (d) is performed with heat sufficient to thermally anneal the sample to correct damage to the crystal lattice of the platform layer caused by said ion implantation.

29. The method of claim 1, wherein the central aperture has either a substantially elliptical or rectangular cross-section to cause polarization of the output of the laser.

30. The method of claim 1, wherein the substrate and layers disposed thereon are part of a wafer sample, further wherein said forming of the current-confinement structure results in native oxide being formed on a top surface of the platform layer, the method further comprising the step of:
(e) after said forming of the current-confinement structure but before performing the epitaxial regrowth of step (d), removing the native oxide from the surface of the platform layer by at least one of desorption, in-situ etching, and in-situ cleaning.

31. The method of claim 1, wherein the first top spacer layer and a second top spacer layer comprising the top current-spreading layer form a composite top spacer layer, the composite top spacer layer having a thickness selected so as to optimally position the active region axially within the laser structure.

32. A method for fabricating a surface-emitting laser having current confinement, the method comprising the steps of:
(a) providing a first laser portion having a substrate, a semiconductor active region, and a bottom mirror disposed between the substrate and the active region;
(b) epitaxially growing a first top spacer layer on the active region, the first top spacer layer comprising a current-spreading buffer layer disposed on the active region and a current-confinement layer disposed on the buffer layer;
(c) forming, in the current-confinement layer, a current-confinement structure having an annular region of enhanced resistivity and a central aperture of comparatively lower resistivity, said step of forming comprising the step of performing ion implantation; and
(d) after said forming of the current-confinement structure, performing epitaxial regrowth to form a top current-spreading layer on the current-confinement layer.

33. The method of claim 32, wherein the thickness of the current-confinement layer is less than one-third of the thickness of the buffer layer.

34. The method of claim 32, further comprising the steps of:
(e) performing epitaxial regrowth to form a contact-facilitating layer on the top current-spreading layer;
(f) forming a metal contact on the contact-facilitating layer, wherein:
the contact-facilitating layer is for electrically coupling the metal contact to the top current-spreading layer;
the top current-spreading layer is sufficiently conductive to conduct pumping current from the metal contact laterally through the top current-spreading layer to the central aperture of the current-confinement structure; and
the annular region has an enhanced resistivity sufficiently greater than that of the central aperture so that most of the pumping current from the metal contact conducted through the top current-spreading layer is blocked by the annular region and forced through the central aperture; and (g) forming a top mirror disposed axially above the first top spacer layer to complete a resonant cavity surrounding the active region.

35. The method of claim 34, wherein the resistance of the annular region to the pumping current conducted through said top current-spreading layer from the metal contact is sufficiently greater than the resistance of the central aperture to said pumping current so that at least about 70% of said pumping current flows through the central aperture instead of through the annular region of enhanced resistivity.

36. The method of claim 32, wherein said platform layer and said substrate consist of InP and said current-confinement layer consists of one of InAlAs and InGaAlAs.

37. The method of claim 32, wherein said ion implantation of step (c) employs an implant energy of less than 400 keV and employs oxygen as an implanted species.

38. The method of claim 32, wherein:
the substrate and layers disposed thereon are part of a wafer sample;
said step (d) further comprising the step of thermally annealing the sample, after said ion implantation, to correct damage to the crystal lattice of the platform layer caused by said ion implantation.

39. A method for fabricating a surface-emitting laser having current confinement, the method comprising the steps of:

(a) providing a first laser portion having a substrate, a semiconductor active region, and a bottom mirror disposed between the substrate and the active region;

(b) epitaxially growing a top spacer layer on the active region, the top spacer layer comprising a current-spreading buffer layer disposed on the active region, a current-confinement layer disposed on the buffer layer, and a current-spreading platform layer disposed on the current-confinement layer, wherein the combined thickness of the platform and current-confinement layers is less than the thickness of the buffer layer;

(c) forming, in the current-confinement layer, a current-confinement structure having an annular region of enhanced resistivity and a central aperture of comparatively lower resistivity, said step of forming comprising the step of performing ion implantation; and (d) forming a contact-facilitating layer on the platform layer.

40. The method of claim 39, wherein the step (d) comprises the step of epitaxially regrowing the contact-facilitating layer on the platform layer after step (c), the method further comprising the steps of:

(e) forming a metal contact on the contact-facilitating layer, wherein:
the contact-facilitating layer is for electrically coupling the metal contact to the platform layer;
the platform layer is sufficiently conductive to conduct pumping current from the metal contact laterally through the platform layer to the central aperture of the current-confinement structure; and
the annular region has an enhanced resistivity sufficiently greater than that of the central aperture so that most of the pumping current from the metal contact conducted through the platform layer is blocked by the annular region and forced through the central aperture; and (g) forming a top mirror disposed axially above the first top spacer layer to complete a resonant cavity surrounding the active region.

41. The method of claim 40, wherein the resistance of the annular region to the pumping current conducted through said platform layer from the metal contact is sufficiently greater than the resistance of the central aperture to said pumping current so that at least about 70% of said pumping current flows through the central aperture instead of through the annular region of enhanced resistivity.

42. The method of claim 40, wherein said platform layer and said substrate consist of InP and said current-confinement layer consists of one of InAlAs and InGaAlAs.

43. The method of claim 39, wherein said ion implantation of step (c) employs an implant energy of less than 400 keV and employs oxygen as an implanted species.

44. The method of claim 39, wherein the step (d) comprises the step of epitaxially regrowing the contact-facilitating layer on the platform layer after step (c).

45. The method of claim 44, wherein the combined thickness of the platform and current-confinement layers is less than one-third of the thickness of the buffer layer.

46. The method of claim 39, wherein:
step (d) comprises the step of epitaxially growing the contact-facilitating layer on the platform layer after step (b) and before step (c); and
the combined thickness of the platform, current-confinement, and contact-facilitating layers is less than the thickness of the buffer layer.

47. The method of claim 39, wherein:
step (d) comprises the step of epitaxially growing the contact-facilitating layer on the platform layer after step (b) and before step (c); and
the combined thickness of the platform, current-confinement, and contact-facilitating layers is less than one-third of the thickness of the buffer layer.

* * * * *